United States Patent
Larsen et al.

(10) Patent No.: US 9,485,568 B2
(45) Date of Patent: *Nov. 1, 2016

(54) POWER MANAGEMENT CONTROLLER FOR DRIVERS

(71) Applicant: CONEXANT SYSTEMS, INC., Newport Beach, CA (US)

(72) Inventors: Christian Larsen, Irvine, CA (US); Lorenzo Crespi, Costa Mesa, CA (US); Mouna Elkhatib, Tustin, CA (US); Mary Xiao-Hua Lu, San Jose, CA (US); James Bunde Villadsen Skov, Laguna Niguel, CA (US)

(73) Assignee: CONEXANT SYSTEMS, INC., Irvine, CA (US)

(*) Notice: Subject to any disclaimer, the term of this patent is extended or adjusted under 35 U.S.C. 154(b) by 271 days.

This patent is subject to a terminal disclaimer.

(21) Appl. No.: 13/693,569

(22) Filed: Dec. 4, 2012

(65) Prior Publication Data

US 2013/0094661 A1    Apr. 18, 2013

Related U.S. Application Data

(63) Continuation of application No. 12/339,635, filed on Dec. 19, 2008, now Pat. No. 8,325,940.

(51) Int. Cl.
| | |
|---|---|
| H04B 15/00 | (2006.01) |
| H04R 3/00 | (2006.01) |
| H03F 1/30 | (2006.01) |
| H03F 3/187 | (2006.01) |
| H03G 3/34 | (2006.01) |

(52) U.S. Cl.
CPC ............... *H04R 3/00* (2013.01); *H03F 1/305* (2013.01); *H03F 3/187* (2013.01); *H03G 3/348* (2013.01); *H03F 2200/03* (2013.01); *H03F 2200/249* (2013.01); *H03F 2200/414* (2013.01)

(58) Field of Classification Search
CPC ............. H03F 1/305; H03F 2200/417; H03F 2200/372; H03F 1/26; H03G 3/348; H03G 3/34; H03G 3/345
USPC .................................. 381/94.5, 94.8; 330/10
See application file for complete search history.

(56) References Cited

U.S. PATENT DOCUMENTS

| | | | |
|---|---|---|---|
| 5,740,453 A | 4/1998 | Lada | |
| 6,281,821 B1 | 8/2001 | Rhode et al. | |
| 6,642,876 B2 | 11/2003 | Subramoniam et al. | |
| 6,775,387 B1 | 8/2004 | Mavencamp et al. | |
| 7,154,308 B2 | 12/2006 | Ho | |
| 8,325,940 B2* | 12/2012 | Larsen et al. ................. | 381/94.5 |
| 2003/0231127 A1 | 12/2003 | Jones | |
| 2005/0025322 A1* | 2/2005 | Henson et al. ................ | 381/120 |
| 2005/0084120 A1 | 4/2005 | Hagino | |
| 2005/0195991 A1 | 9/2005 | Wang et al. | |
| 2006/0013413 A1 | 1/2006 | Sakaidani | |
| 2006/0245602 A1 | 11/2006 | Chi et al. | |

(Continued)

FOREIGN PATENT DOCUMENTS

WO        2006/031304 A2        3/2006

*Primary Examiner* — Alexander Jamal
(74) *Attorney, Agent, or Firm* — Haynes and Boone, LLP

(57) ABSTRACT

A driver controller comprising a state machine for controlling transitions between a plurality of states. An output switch for providing a low impedance path to ground during transition periods. An output stage for decoupling output signal from driver amplifier during the transition periods.

20 Claims, 4 Drawing Sheets

(56) References Cited

U.S. PATENT DOCUMENTS

| | | |
|---|---|---|
| 2006/0285700 A1 | 12/2006 | Felder et al. |
| 2007/0018719 A1* | 1/2007 | Seven .............................. 330/51 |
| 2007/0206489 A1 | 9/2007 | Torrini |
| 2008/0018395 A1 | 1/2008 | Chi et al. |
| 2008/0088370 A1 | 4/2008 | You et al. |
| 2009/0102550 A1* | 4/2009 | Ohama ..................... H03F 1/26 330/10 |
| 2010/0158270 A1 | 6/2010 | Chao et al. |

* cited by examiner

POWER MANAGEMENT CONTROLLER FOR DRIVERS

CROSS-REFERENCE TO RELATED APPLICATION

The present application is a continuation application of U.S. patent application Ser. No. 12/339,635, filed Dec. 19, 2008, now U.S. Pat. No. 8,325,940, which is hereby incorporated by reference for all purposes.

FIELD OF THE INVENTION

The invention relates to power management control of drivers, and more specifically to a method and apparatus for power and pop management control for DC-coupled headphone drivers in PC High Definition (HD) audio codecs.

BACKGROUND OF THE INVENTION

Prior art audio driver designs for HD audio codecs have limited or no power management. Such drivers do not have multiple power states, and only toggle between full power and shutdown, which can cause the creation of unpleasant audible audio artifacts. While some attempts have been made to address power management so as to reduce the generation of unpleasant audio artifacts, those systems and methods did not effectively deal with power management and elimination of audio artifacts.

SUMMARY OF THE INVENTION

The current invention provides a method and apparatus for controlling power to drivers that optimizes power use and eliminates audio artifacts.

In accordance with an exemplary embodiment of the present invention, a driver controller comprising a state machine, such as a port controller, for controlling transitions between a plurality of states is provided. An output switch coupled to the state machine is used to provide a low impedance path to ground during transition periods. An output stage coupled to the state machine is used to decouple the output signal from the driver amplifier during the transition periods.

Those skilled in the art will further appreciate the advantages and superior features of the invention together with other important aspects thereof on reading the detailed description that follows in conjunction with the drawings.

DETAILED DESCRIPTION OF PREFERRED EMBODIMENTS

Figure 1:
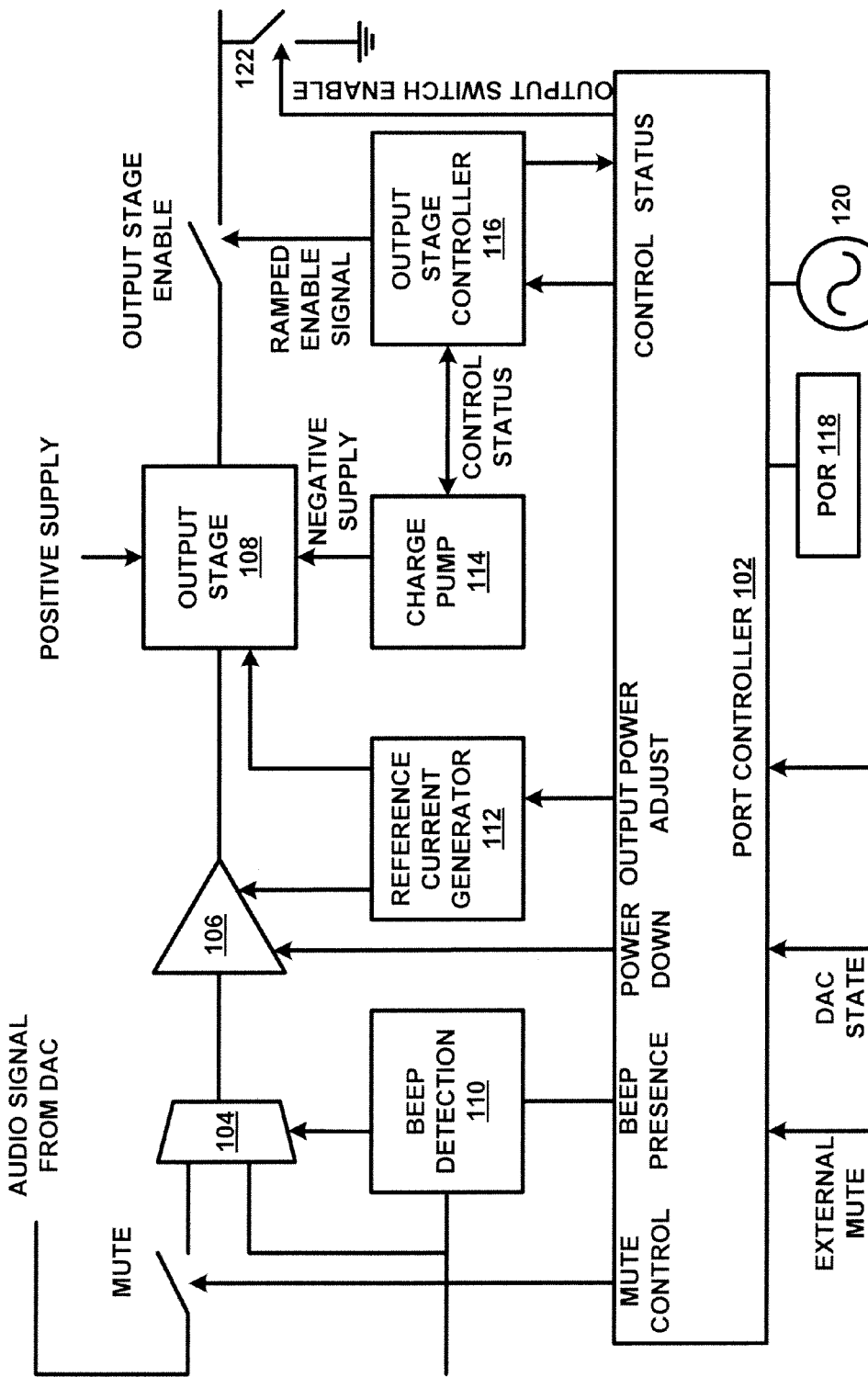
FIG. 1 is a diagram of a system for managing drivers in accordance with an exemplary embodiment of the present invention.

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a system 100 for managing drivers in accordance with an exemplary embodiment of the present invention. System 100 allows power management for drivers to be accomplished without adversely affecting the performance of the devices associated with the drivers.

System 100 can be implemented in hardware, software or a suitable combination of hardware and software, and can be one or more hardware components operating in conjunction with an integrated circuit. As used herein, "hardware" can include a combination of discrete components, an integrated circuit, an application-specific integrated circuit, a field programmable gate array, a digital signal processor, or other suitable hardware. As used herein, "software" can include one or more objects, agents, threads, lines of code, subroutines, separate software applications, two or more lines of code or other suitable software structures operating in two or more software applications or on two or more processors, or other suitable software structures. In one exemplary embodiment, software can include one or more lines of code or other suitable software structures operating in a general purpose software application, such as an operating system, and one or more lines of code or other suitable software structures operating in a specific purpose software application.

System 100 receives an audio signal from a digital to analog converter, which is provided to a mute switch that can toggle between an open state when a mute control is received to a closed state when no mute control has been received. Multiplexer 104 receives the audio signal and a personal computer (PC) beep signal, which can be generated by the PC based on a number of predetermined operating events. Beep detection 110 is used to provide a control signal to multiplexer 104 when the audio signal and the PC beep signal are present, and provides a beep presence signal to port controller 102.

Driver amplifier 106 is used to amplify the signal provided from multiplexer 104, and provides an output to output stage 108, which is used to provide novel control and power management functions as well as drive the output signal into a low-impedance load. Reference current generator 112 provides a constant current signal to driver amplifier 106 and an adjustable current signal to output stage 108, based upon an output bias adjust signal received from port controller 102. Driver amplifier 106 can also receive a power down signal from port controller 102.

Output stage controller 116 receives control data from port controller 102 and provides status data to port controller 102. Output stage controller also provides a ramp enable signal to output stage enable switch, and receives status signals from charge pump 114, which provides a negative voltage supply to output stage 108. Output stage 108 also receives a positive voltage supply, as described below.

System 100 includes port controller 102, which can be a state machine that provides control and sequencing of driver blocks. In one exemplary embodiment, port controller 102 can provide a state machine for headphone driver blocks or other suitable driver blocks in a high definition (HD) audio system. Digital to analog converter (DAC) state information is provided to port controller 102, as well as HD audio interface control data, and port controller uses that data in conjunction with other external data such as PC beep data and external mute data to control and sequence headphone driver states and operations.

Port controller 102 receives a clock signal from oscillator 120, which can be a resistor-capacitor oscillator circuit or other suitable oscillators. An internal reset control is provided for port controller 102, which allows port controller 102 to operate even when the HD audio interface is disabled. In this manner, port controller 102 can respond to PC beep data even when the PC is in a shut down state. Port controller 102 can also receive an external mute signal, a digital to analog converter state signal, an HD audio interface control signal, a signal from power on reset 118 to clock all state machines, and other suitable signals.

Port controller 102 is coupled to output switch 122 and other components of system 100, and can provide an output switch enable signal. As used herein, the term "coupled" and its cognate terms such as "couples" or "couple," can include a physical connection (such as wire, optical fiber, or a telecommunications medium), a virtual connection (such as through randomly assigned memory locations of a data memory device or a hypertext transfer protocol (HTTP) link), a logical connection (such as through one or more semiconductor devices in an integrated circuit), other suitable connections, or a suitable combination of connections.

Output switch 122 provides a low impedance path to ground for the driver, such as a headphone driver or other suitable drivers. In one exemplary embodiment, output switch 122 can suppress undesirable audio data such as pops and ticks when used with a headphone driver and the headphone driver is powered up and in an undetermined state. In this exemplary embodiment, a large amount of capacitance may be present between the output node and the power supply of the driver, such that when the power supply ramps up or ramps down, the output node will track the ramp and create undesirable audio artifacts, unless there is a low impedance path to ground.

Output stage 108 can drive a large signal into a low impedance load with 0.0 volts common mode when enabled. In one exemplary embodiment, the positive supply to output stage 108 can be 3.3 volts, and the negative supply from charge pump 114 can be adjusted from −2.0 to −2.6 volts, when enabled. Other suitable voltage levels can also or alternatively be used. Because charge pump 114 can be provided on the same integrated circuit as the other components of system 100, charge pump 114 can be disabled when it is not needed, such as when the headphone driver or other suitable drivers are disabled.

Output stage 108 decouples the output signal from the driver amplifier 106, the positive supply and negative supply when the output stage 108 is disabled. The output stage 108 is kept disabled during the transitions of the negative and positive supplies, as well as during the power up and power down transitions of the driver amplifier. When the output stage 108 is disabled, the output switch 122 is enabled so that the output node is held to 0.0 volts.

After the positive supply, the negative supply and the driver amplifier 106 are enabled, output stage 108 is enabled. The output stage enable signal is ramped slowly to avoid sudden transients on the output node. The output from reference current generator 112 is then increased, and finally the output switch 122 is disabled, such that the headphone driver or other suitable driver is in its normal closed-loop configuration and driving the signal.

Reference current generator 112 can be used to bias output stage 108 with an adjustable reference current. In one exemplary embodiment, the bias current can be adjusted to a low percentage of its functional value, such as 1.0 percent or other suitable values, so that output stage 108 does not generate any discontinuities or other undesirable output, because the output node is held at 0.0 volts by output switch 122. If the bias current from reference current generator 112 is not reduced, then output stage 108 will be capable of overdriving the output switch and creating undesirable audio artifacts.

In operation, system 100 provides power management for a driver, such as an audio coder-decoder driver or other suitable drivers, which eliminates undesired signals during transition states. System 100 controls power to output nodes so as to prevent power from being applied during transition events when the additional power would create unwanted signals or other unwanted audio artifacts.

Figure 2:
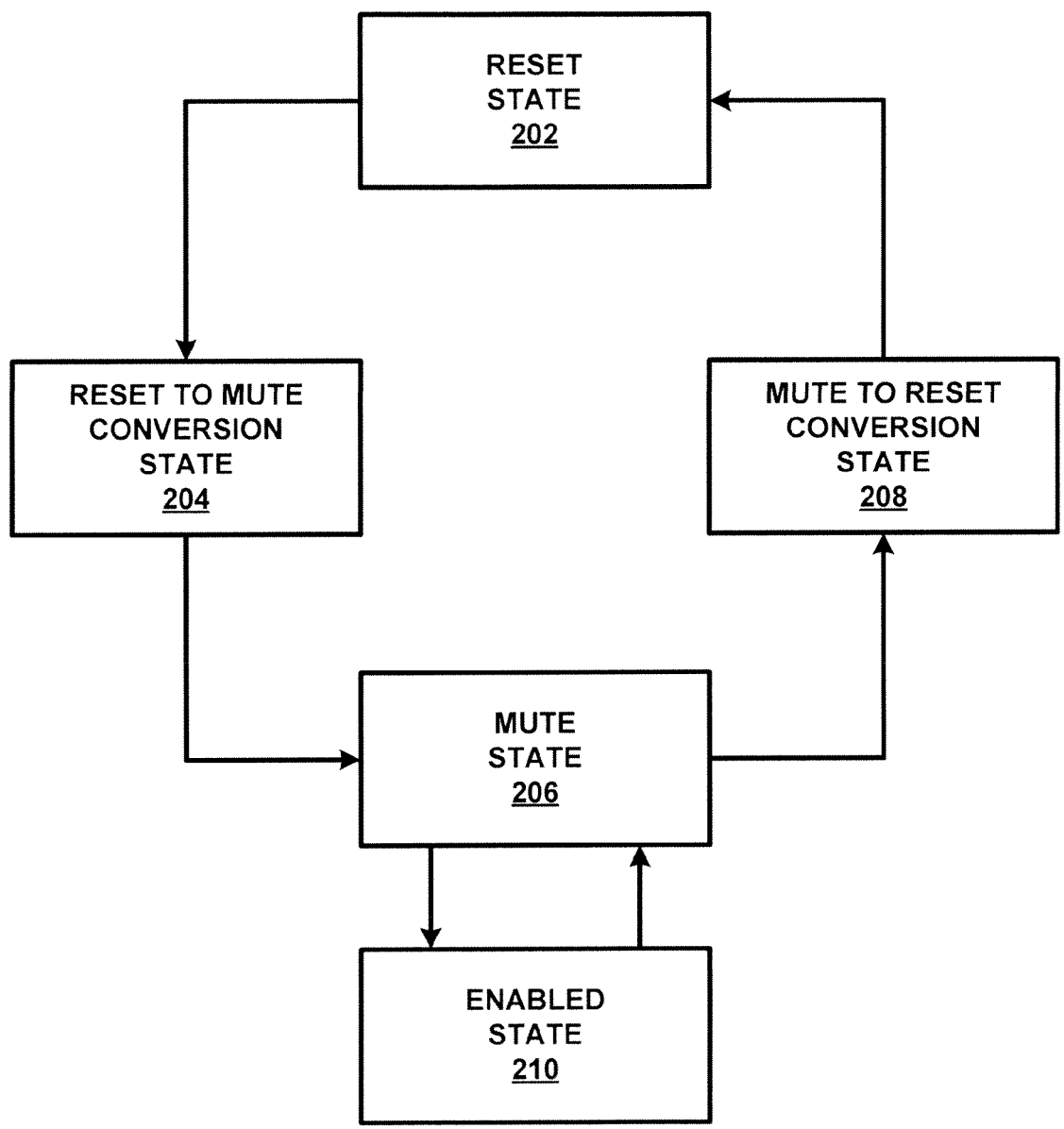
FIG. 2 is a diagram of a state machine in accordance with an exemplary embodiment of the present invention.

FIG. 2 is a diagram of a state machine 200 in accordance with an exemplary embodiment of the present invention. State machine 200 can be used by port controller 102 of system 100 or other suitable systems to provide control and power management, and for other suitable functions.

State machine 200 includes reset state 202, which can be used to control the state of port controller 102 or other suitable systems if an associated driver for an interface, such as an HD audio interface, generates state data that defines a driver node as being disabled, in a mode other than full-power, or other suitable state data. In one exemplary embodiment, reset state 202 transitions to reset to mute conversion state 204 if an HD audio interface specifies that the driver node is both enabled and at full power, if an HD audio interface specifies that the driver node is enabled and PC beep is detected, or based on other suitable data. If the reset state 202 detects or receives transition data, reset state 202 transitions to reset to mute conversion state 204.

In one exemplary embodiment, reset to mute conversion state 204 can be a transition state that can be used to allow the driver amplifier, such as driver amplifier 106 of FIG. 1, and the output stage, such as output stage 108 of FIG. 1, to power up. In this exemplary embodiment, the driver amplifier can be powered up, and then a negative supply such as charge pump 114 of FIG. 1 can be enabled. When the negative supply has settled, the output stage can be enabled. In this exemplary embodiment, a transition from reset to mute conversion state 204 to mute state 206 can occur when enabling of the output stage is completed or in other suitable situations.

Mute state 206 can be used to allow a connected digital to analog converter or other suitable devices to power up before allowing transition to enabled state 210 or for other suitable purposes. In one exemplary embodiment, where a digital to analog converter audio signal is played through a driver, the output stage bias, such as from reference current generator 112, can be increased to 100 percent or other suitable levels, at which point output switch 122 is disabled. In another exemplary embodiment, mute state 206 can be used to generate beeps through the driver in the event a PC beep is received, or other suitable processes can be managed by mute state 206. Mute state 206 then allows a transition to enabled state when one or more predetermined state variables are at predetermined values.

Enabled state 210 can be used to monitor for one or more conditions to transition back to mute state 206. In one exemplary embodiment, a transition to mute state 206 can be triggered if an HD audio interface specifies that the driver node is disabled, not at full power, or if other driver node conditions exist. In another exemplary embodiment, a transition to mute state 206 can be triggered if a connected digital to analog converter is no longer enabled, has completed its ramping so that it is driving 0.0 volts, or has other predetermined states, such as to prevent generation of audio artifacts that can be caused by data truncation or other events. In another exemplary embodiment, a transition to mute state 206 can be triggered if an external mute signal is activated. Likewise, other suitable events or data can be used to cause a transition from enabled state 210 to mute state 206.

Once a transition from enabled state 210 to mute state 206 has occurred or in other suitable situations, a transition to mute to reset conversion state 208 can occur. In one exemplary embodiment, if a connected digital to analog converter is no longer enabled, has completed its ramping so that it is driving 0.0 volts, or has other predetermined states, the transition to mute to reset conversion state 208 can occur. Likewise, other suitable conditions or data can be used to transition from mute state 206 to mute to reset conversion state 208. In one exemplary embodiment, output switch 122 can first be enabled, then the output stage bias can be reduced to 1.0 percent or other suitable values, after which output stage power down sequencing or other suitable functions can be started. After the output stage is fully powered down, the negative supply, such as charge pump 114 of FIG. 1, can be disabled, the amplifier, such as amplifier 106 of FIG. 1, can be disabled, and mute to reset conversion state 208 can then transition to reset state 202.

In operation, state machine 200 can be used to provide substantial power savings, such as where a PC is in a full power state but audio playback through a headphone driver has been disabled. State machine 200 allows components of a driver system to be powered off without the generation of audio artifacts, unlike prior art systems and methods that required some components to remain powered up to maintain bias or suppress generation of audio artifacts. State machine 200 also requires no dependence on the main voltage reference, such that operation of an associated driver is not delayed where there is a long ramp-up time for the main voltage reference. Likewise, power down is not limited by the state of the main voltage reference. For example, a headphone driver can be disabled when a main voltage reference is enabled.

Figure 3:
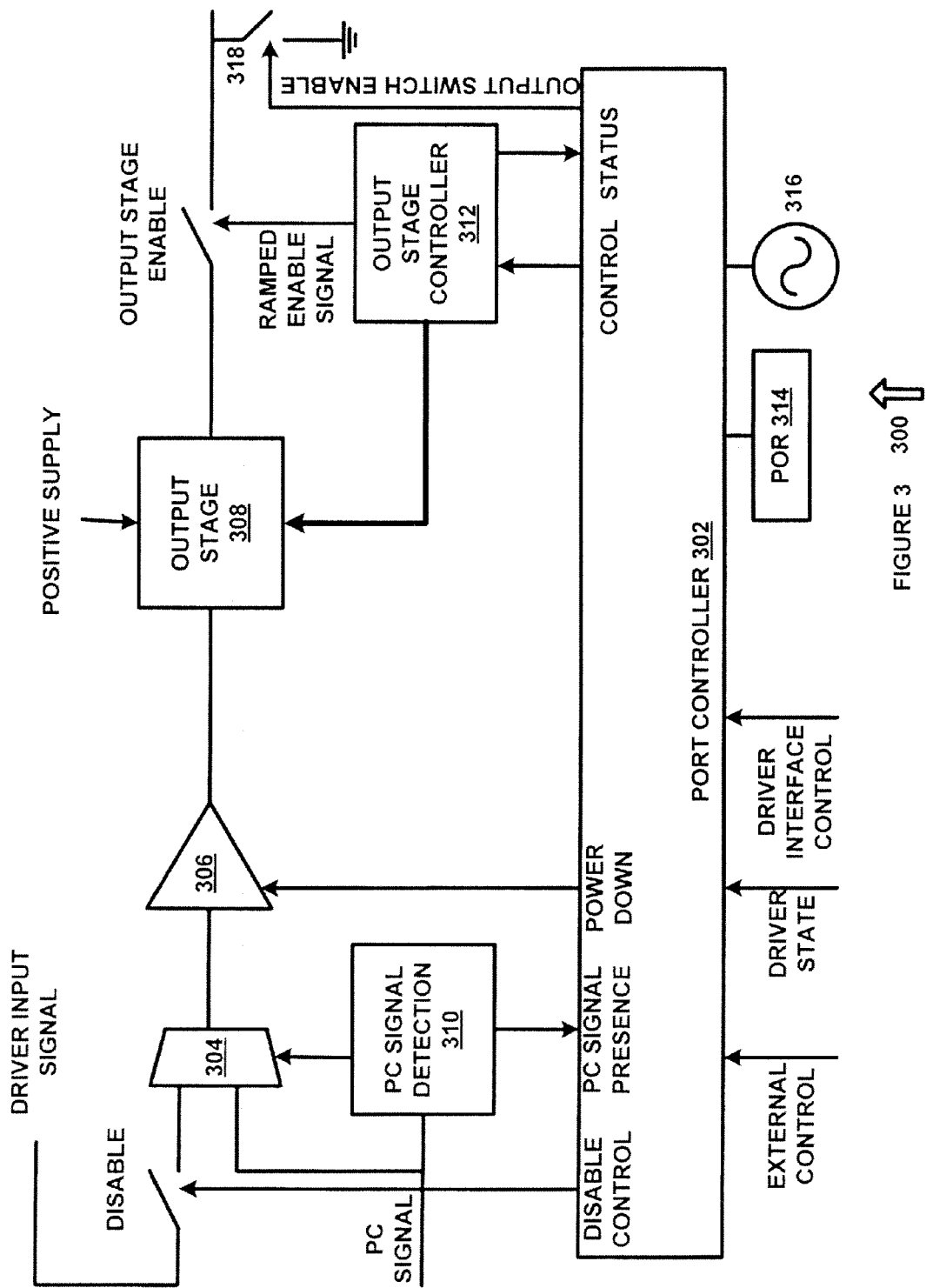
FIG. 3 is a diagram of a system for managing drivers in accordance with an exemplary embodiment of the present invention.

FIG. 3 is a diagram of a system 300 for managing drivers in accordance with an exemplary embodiment of the present invention. System 300 allows power management for drivers to be accomplished without adversely affecting the performance of the devices associated with the drivers.

System 300 can be implemented in hardware, software or a suitable combination of hardware and software, and can be one or more hardware components operating in conjunction with an integrated circuit. System 300 receives a driver input signal, which is provided to a disable switch, which can toggle between an open state when a disable control is received to a closed state when no disable control has been received. Multiplexer 304 receives the driver input signal and a PC signal, which can be generated by the PC based on a number of predetermined operating events. PC signal detection 310 is used to control multiplexer 304 when the driver input signal and the PC signal are present, and provides a PC signal presence input to port controller 302.

Driver amplifier 306 is used to amplify the signal provided from multiplexer 304, and provides an output to output stage 308, which is used to provide novel control and power management functions as well as drive the output signal into a low-impedance load. Driver amplifier 306 can also receive a power down signal from port controller 302.

Output stage controller 312 receives control data from port controller 302 and provides status data to port controller 302. Output stage controller also provides a ramp enable signal to output stage enable switch, and provides power, control or other suitable signals to and receives power, control or other suitable signals from output stage 308. Output stage 308 can also receive a positive voltage supply.

System 300 includes port controller 302, which can be a state machine that provides control and sequencing of driver blocks. In one exemplary embodiment, port controller 302 can provide a state machine for driver blocks for a peripheral device for a PC. Driver state information is provided to port controller 302, as well as driver interface control data, and port controller 302 uses that data in conjunction with other external data such as PC signal data and external control data to control and sequence driver states and operations.

Port controller 302 receives a clock signal from oscillator 316, which can be a resistor-capacitor oscillator circuit or other suitable oscillators. An internal reset control is provided for port controller 302, which allows port controller 302 to operate even when the driver interface is disabled. In this manner, port controller 302 can respond to PC signal data even when the PC is in a shut down state. Port controller 302 can also receive an external control signal, a driver state signal, a driver interface control signal, power on reset 314 to clock all state machines, and other suitable signals and data.

Port controller 302 is coupled to output switch 318, and can provide an output switch enable signal. Output switch 318 provides a low impedance path to ground for the driver. In one exemplary embodiment, output switch 318 can suppress undesirable transients when used with a driver that is sensitive to transients and the driver is powered up and in an undetermined state. In this exemplary embodiment, a large amount of capacitance may be present between the output node and the power supply of the driver, such that when the power supply ramps up or ramps down, the output node will track the ramp up and create undesirable transients, unless there is a low impedance path to ground.

Output stage 308 can drive a large signal into a low impedance load with 0.0 volts common mode when enabled. In one exemplary embodiment, the positive supply to output stage 308 can be 3.3 volts. Output stage 308 decouples the output signal from the driver amplifier 306 and any supply when the output stage 308 is disabled. The output stage 308 is kept disabled during the transitions of any supply, as well as during the power up and power down transitions of the driver amplifier. When the output stage 308 is disabled, the output switch 318 is enabled so that the output node is held to 0.0 volts during the ramp.

After any supply and the driver amplifier 306 are fully enabled output stage 308 is enabled. The output stage enable signal is ramped slowly to avoid sudden transients on the output node. Output switch 318 is then disabled, such that the driver is in its normal closed-loop configuration and driving the signal.

Output stage controller 312 can also be used to bias output stage 308 with an adjustable reference current. In one exemplary embodiment, the bias current can be adjusted to a low percentage of its functional value, such as 1.0 percent or other suitable values, so that output stage 308 does not generate any discontinuities or other undesirable output, because the output node is held at 0.0 volts by output switch 318. If the bias current from output stage controller 312 is not reduced, then output stage 308 will be capable of overdriving the output switch and creating undesirable signals.

In operation, system 300 provides power management for a driver, which eliminates undesired signals during transition states. System 300 controls power to output nodes so as to prevent power from being applied during transition events when the additional power would create unwanted signals or data.

Figure 4:
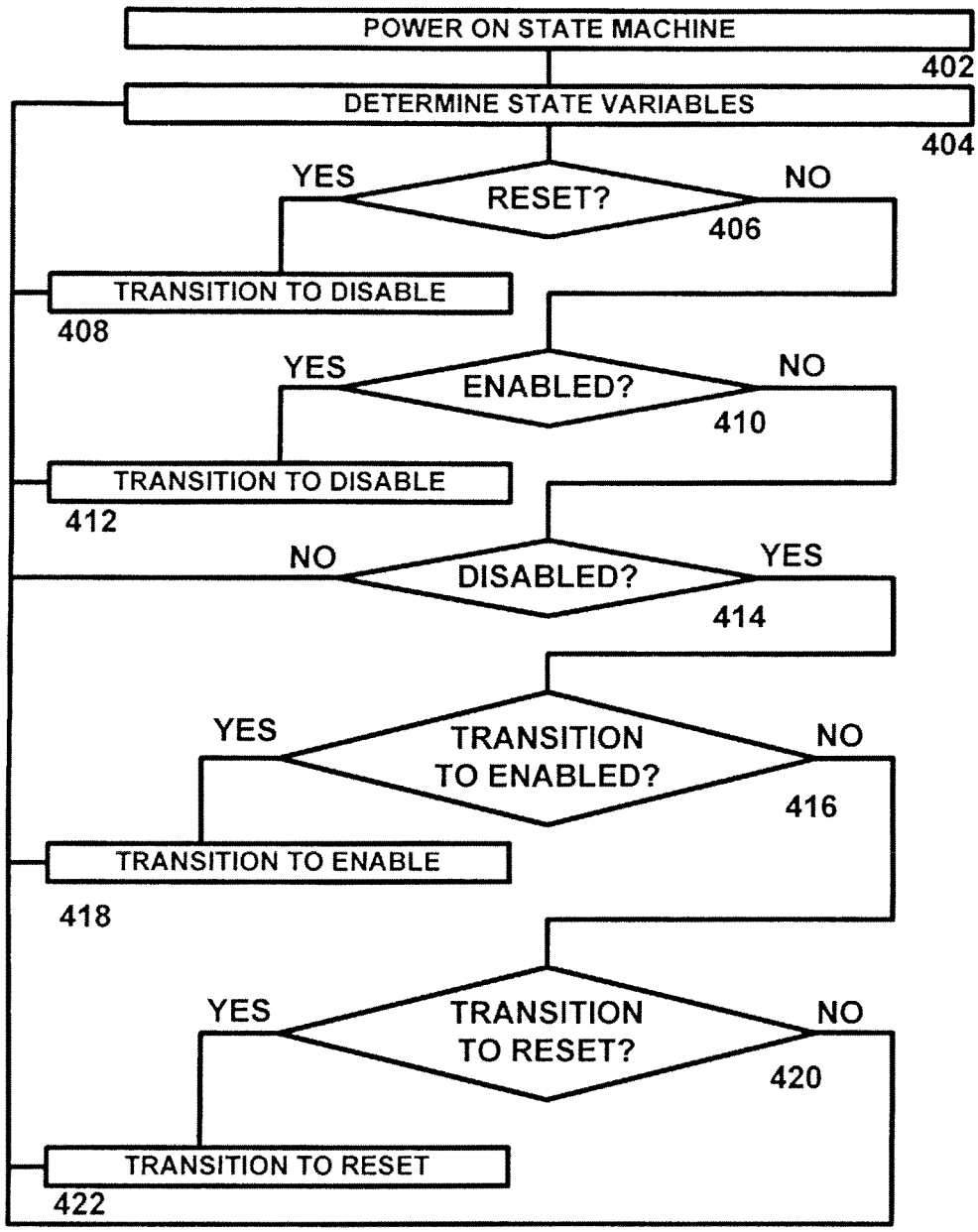
FIG. 4 is a flow chart of a method for managing drivers in accordance with an exemplary embodiment of the present invention.

FIG. 4 is a flow chart of a method 400 for managing drivers in accordance with an exemplary embodiment of the present invention. Method 400 can be implemented in a programmable device, by an integrated circuit and associated components, or in other suitable manners.

Method 400 begins at 402, where a state machine is powered on. In one exemplary embodiment, the state machine can have an associated clock that is used to control the timing of the operations of the state machine. The method then proceeds to 404.

At 404, state variables are determined, such as the power settings of amplifier and output stages, output stage current bias, output switch state, mute control data and other suitable state data. The method then proceeds to 406.

At 406, it is determined whether the current state is a reset state. If the current state is not a reset state, the method proceeds to 410, otherwise the method proceeds to 408 where a transition to disable is performed, such as when predetermined state variables reach predetermined values. In one exemplary embodiment, where the disabled state is a mute state, the transition to disable can occur after it is determined that output stage power up has been completed. The method then returns to 404.

At 410, it is determined whether the current state is an enabled state. If the current state is not an enabled state, the method proceeds to 414, otherwise the method proceeds to 412 where a transition to disable is performed, such as when predetermined state variables reach predetermined values. In one exemplary embodiment, where the disabled state is a mute state, a transition from the enabled state to the mute state can occur when a driver is no longer enabled or in full power, if a digital to analog convert is no longer enabled, if an external mute control has been received, or based on other suitable conditions. The method then returns to 404.

At 414, it is determined whether the current state is a disabled state. If the current state is not a disabled state, the method returns to 404, otherwise the method proceeds to 416 where it is determined whether to transition to enabled. In one exemplary embodiment, when the disabled state is a mute state, a transition to enable is performed at 418 if a driver is enabled and at full power, and if a digital to analog converter that is connected to the driver is enabled and at full power. The method then returns to 404. If it is determined at 416 not to transition to enabled, the method proceeds to 420.

At 420, it is determined whether to transition to reset. If it is determined not to transition to reset, the method returns to 404. Otherwise, the method proceeds to 422 where a transition to reset is performed. In one exemplary embodiment, where a driver is no longer enabled or in full power, if PC beep has ended or if an external mute is activated, transition to reset can be performed when the output stage is in low bias, the output switch is enabled, and the output stage is powered down. The transition to reset can then be completed when the output stage power down is complete.

In operation, method 400 provides for managing transitions between three or more different states, such as for a driver for an HD audio interface or other suitable components. Method 400 allows power management to be performed to prevent the generation of unwanted signals.

Although exemplary embodiments of an apparatus the present invention have been described in detail herein, those skilled in the art will also recognize that various substitutions and modifications can be made to the apparatus without departing from the scope and spirit of the appended claims.

What is claimed is:

1. A method for controlling a driver comprising:
   determining a first audio driver state based on a plurality of first driver state variables;
   receiving one or more second state variables;
   transitioning from the first audio driver state to one of a plurality of second audio driver states in response to the one or more second state variables; and
   disabling an output stage during state transition periods, wherein disabling an output stage comprises enabling an output switch to electrically decouple an output signal from a driver amplifier and electrically couple the output signal to a low impedance path to ground during said state transition periods.

2. The method of claim 1 wherein determining the first audio driver state based on the plurality of first driver state variables comprises determining an audio driver reset state based on an amplifier state variable and an output stage state variable.

3. The method of claim 1 wherein determining the first audio driver state based on the plurality of first driver state variables comprises determining an audio driver mute state based on an output switch state variable and an output stage state variable.

4. The method of claim 1 wherein determining the first audio driver state based on the plurality of first driver state variables comprises determining an enabled audio driver state based on a driver state variable and a digital to analog converter state variable.

5. The method of claim 1 further comprising: receiving one or more third state variables; and transitioning from the one of the plurality of second audio driver states to another of the plurality of second audio driver states in response to the one or more third state variables.

6. A method for controlling a driver comprising:
   determining a first audio driver state based on a plurality of first driver state variables at a port controller;
   receiving one or more second state variables at the port controller;
   transitioning from the first audio driver state to one of a plurality of second audio driver states with the port controller in response to the one or more second state variables, and
   disabling an output stage during state transition periods, wherein disabling an output stage comprises enabling an output switch to electrically decouple an output signal from a driver amplifier and couple the output signal to a low impedance path to ground during said state transition periods.

7. The method of claim 6 wherein determining the first audio driver state based on the plurality of first driver state variables at the port controller comprises determining an audio driver reset state based on an amplifier state variable and an output stage state variable at the port controller.

8. The method of claim 6 wherein determining the first audio driver state based on the plurality of first driver state variables at the port controller comprises determining an audio driver mute state based on an output switch state variable and an output stage state variable at the port controller.

9. The method of claim 6 wherein determining the first audio driver state based on the plurality of first driver state variables comprises determining an enabled audio driver state based on a driver state variable and a digital to analog converter state variable.

10. The method of claim 6 further comprising:
receiving one or more third state variables at the port controller; and
transitioning from the one of the plurality of second audio driver states to another of the plurality of second audio driver states at the port controller in response to the one or more third state variables.

11. The method of claim 6 further comprising:
receiving one or more third state variables at the port controller; and
transitioning from the one of the plurality of second audio driver states to one of the first driver state or another of the plurality of second audio driver states at the port controller in response to the one or more third state variables.

12. The method of claim 6 wherein the plurality of first driver state variables comprises external mute state data.

13. The method of claim 6 wherein the plurality of first driver state variables comprises digital to analog converter state data.

14. A method for controlling a driver comprising:
determining a first audio driver state based on a plurality of first driver state variables at a port controller;
receiving one or more second state variables at the port controller;
transitioning from the first audio driver state to one of a plurality of second audio driver states with the port controller in response to the one or more second state variables; and
disabling an output stage during state transition periods, wherein disabling an output stage comprises enabling an output switch to electrically decouple an output signal from a driver amplifier and electrically couple the output signal to a low impedance path to ground during said state transition periods.

15. The method of claim 14 wherein the plurality of second audio driver states comprises a reset state.

16. The method of claim 14 wherein the plurality of second audio driver states comprises a mute state.

17. The method of claim 14 wherein the plurality of second audio driver states comprises an enabled state.

18. The method of claim 1 wherein disabling an output stage during said state transition periods further comprises reducing an output stage bias current during said state transition periods.

19. The method of claim 6 wherein disabling an output stage during said state transition periods further comprises reducing an output stage bias current during said state transition periods.

20. The method of claim 14 wherein disabling an output stage during said state transition periods further comprises reducing an output stage bias current during said state transition periods.

* * * * *